United States Patent [19]

Dingley

[11] 4,070,623
[45] Jan. 24, 1978

[54] MOVING-COIL ELECTRICAL INSTRUMENTS WITH BEARING STRUCTURE

[75] Inventor: Maurice Dingley, Sutton, England

[73] Assignee: Smiths Industries Limited, London, England

[21] Appl. No.: 657,004

[22] Filed: Feb. 10, 1976

[30] Foreign Application Priority Data

Feb. 12, 1975 United Kingdom ............... 5859/75

[51] Int. Cl.² .......................... G01R 5/02; G01R 1/10
[52] U.S. Cl. ................................ 324/150; 308/238; 324/155
[58] Field of Search ............. 324/150, 154 R, 154 PB, 324/155; 308/238

[56] References Cited

U.S. PATENT DOCUMENTS

| | | | |
|---|---|---|---|
| 1,501,698 | 7/1924 | Beckert | 324/155 X |
| 1,826,409 | 10/1931 | Zubaty | 324/155 X |
| 2,654,070 | 9/1953 | Lamb | 324/155 |
| 2,887,657 | 5/1959 | Lamb et al. | 324/155 X |
| 3,141,132 | 7/1964 | Stewart | 324/155 X |
| 3,874,752 | 4/1975 | Imazaike | 308/238 |

*Primary Examiner*—Gerard R. Strecker
*Attorney, Agent, or Firm*—Pollock, VandeSande and Priddy

[57] ABSTRACT

In a moving-coil electrical instrument the electric coil is rotatably mounted on a spindle for angular displacement about the axis of the spindle. The ends of the spindle are located in respective bearings disposed in apertures of a frame and each bearing has a part that is angularly displaceable about the axis of the spindle between a first angular position in which the part supports the spindle and a second angular position in which that part is removable from the respective aperture. The coil is mounted on a support through which the spindle extends and carries a body to counter-balance the coil. The center of mass of this body is spaced from the plane which includes both the center of mass of the coil and the spindle axis. The support also carries a counterpoise body that is spaced from the counter-balance body about the spindle axis.

17 Claims, 12 Drawing Figures

MOVING-COIL ELECTRICAL INSTRUMENTS WITH BEARING STRUCTURE

This invention relates to moving coil electrical instruments.

Known moving-coil electrical instruments involve an electric coil which is carried by a spindle for angular displacement about the axis thereof and which embraces a core member of a magnetic circuit assembly, and a frame in which respective ends of the spindle are journalled. In instruments in which the coil rotates through an arc of 180° or less, the core member is usually cylindrical with the coil disposed symmetrically about the axis, whereas instruments in which the coil rotates through an arc in excess of 180° normally have an annular core member and the coil appropriately radially-displaced from the axis. In both types of instrument the bearings in which the spindle is journalled permit adjustment of the axial position of the coil and spindle assembly so that both the end-play of the spindle and the clearance between the coil and the core member may be adjusted to accommodate for manufacturing and assembly tolerances. Conventionally, the bearings are screw-threaded and engage with appropriate screw-threads in the frame, so that the desired adjustments can be effected by appropriately rotating the bearings in the frame.

Such adjustments have been effected subsequent to assembly of the instrument and are very delicate and time-consuming.

According to a first aspect of the present invention there is provided a moving-coil electrical instrument comprising a frame defining a pair of aligned apertures, a spindle, a pair of bearings mounted in said apertures in which respective ends of the spindle are rotatably mounted, one of said bearings having a part mounted in the respective said aperture for movement between first and second angular positions about the said axis of the spindle, an electric coil, means mounting the electric coil on the spindle for angular displacement about the axis thereof, a core member of a magnetic circuit embraced by said coil, and means to co-operate with the said bearing part to mount that part in the respective said aperture when in said first angular position and to permit removal of the part from the respective said aperture when in said second angular position.

According to a second aspect of the present invention there is provided a moving-coil electrical instrument comprising a frame defining a pair of aligned apertures, a spindle, a pair of bearings mounted in said apertures in which respective ends of the spindle are rotatably mounted, each of said bearings having a part mounted in the respective said aperture for movement between first and second angular positions about the said axis of the spindle, an electric coil, means mounting the electric coil on the spindle for angular displacement about the axis thereof, a core member of a magnetic circuit embraced by said coil, and individual means to cooperate with each said bearing part to mount those parts in their respective said apertures when in said first angular positions and to permit removal of those parts from their respective said apertures when in said second angular positions.

In the case of instruments having an annular core member and a coil radially displaced from the spindle, the support for the coil former has heretofor included weights to counterbalance the coil about the axis. The position of these weights has been adjusted to compensate for the effects of manufacturing and assembly tolerances in the precise coil weight and the distances between the spindle and the coil. Conventional coil assemblies usually have five adjustable (screw-threaded) weights. The manufacture of these weights and of the support with the requisite threaded arms is very expensive, and precise balancing of the coil assembly is difficult and time consuming.

According to a third aspect of the present invention there is provided a coil assembly for a moving-coil electrical instrument comprising a support member having an aperture to facilitate mounting of the support member upon a spindle, an electric coil mounted on the support member with the coil being radially displaced from the longitudinal axis of the said aperture, a body mounted on the support member to counterbalance the coil, the center of mass of the said body being spaced from the plane which includes both the center of mass of the coil and the longitudinal axis of the said aperture, and a counterpoise body mounted on the support body and spaced from the said counterbalance body about the said longitudinal body.

According to a fourth aspect of the present invention there is provided a moving-coil electrical instrument comprising a frame defining a pair of aligned apertures, a spindle, a pair of bearings in said apertures in which respective ends of the spindle are rotatably mounted, one of the said bearings having a part mounted in the respective said aperture for movement between first and second angular positions about the said axis of the spindle, a support member mounted on the said spindle, an electric coil mounted on the support member with the coil being radially displaced from the spindle, a body mounted on the support member to counter-balance the coil, the center of mass of the said body being spaced from the plane which includes both the center of mass of the coil and the longitudinal axis of the spindle, a core member of a magnetic circuit embraced by the said coil, and means to co-operate with the said bearing part to mount that part in the respective said aperture when in said first angular position and to permit removal of the part from the respective said aperture when in said second angular position.

A moving-coil electrical instrument in accordance with this invention will now be described, by way of example, with reference to the accompanying drawings, in which.

Figure 1:
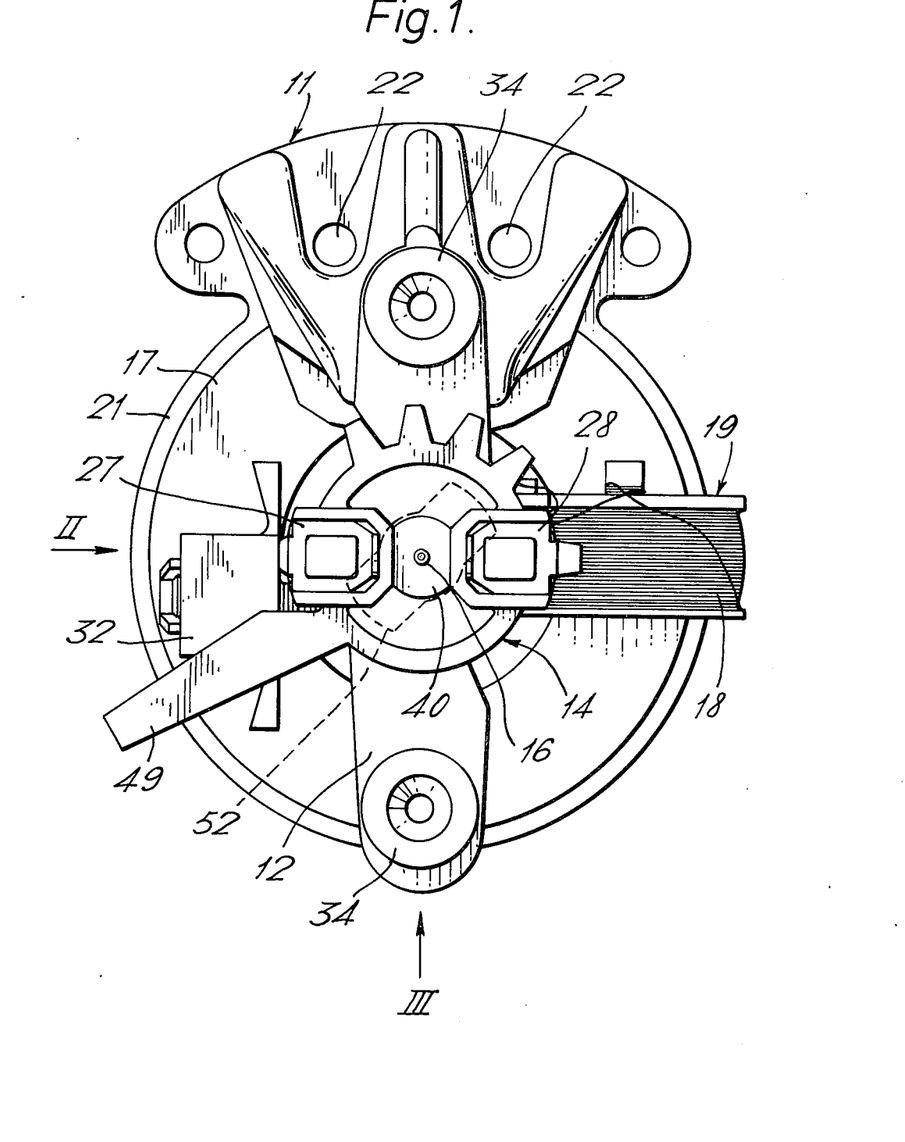
FIG. 1 is a plan view of the instrument.
Figure 2:
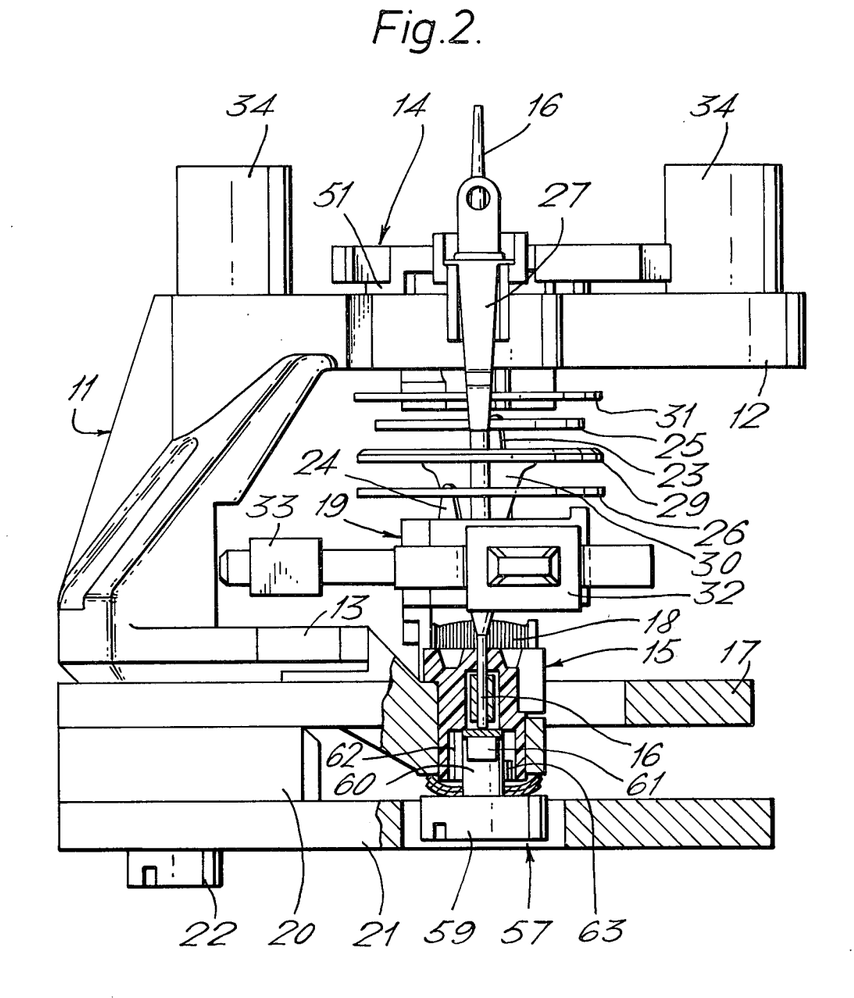
FIG. 2 is a side view, partly in section, in the direction of the arrow II of FIG. 1.
Figure 3:
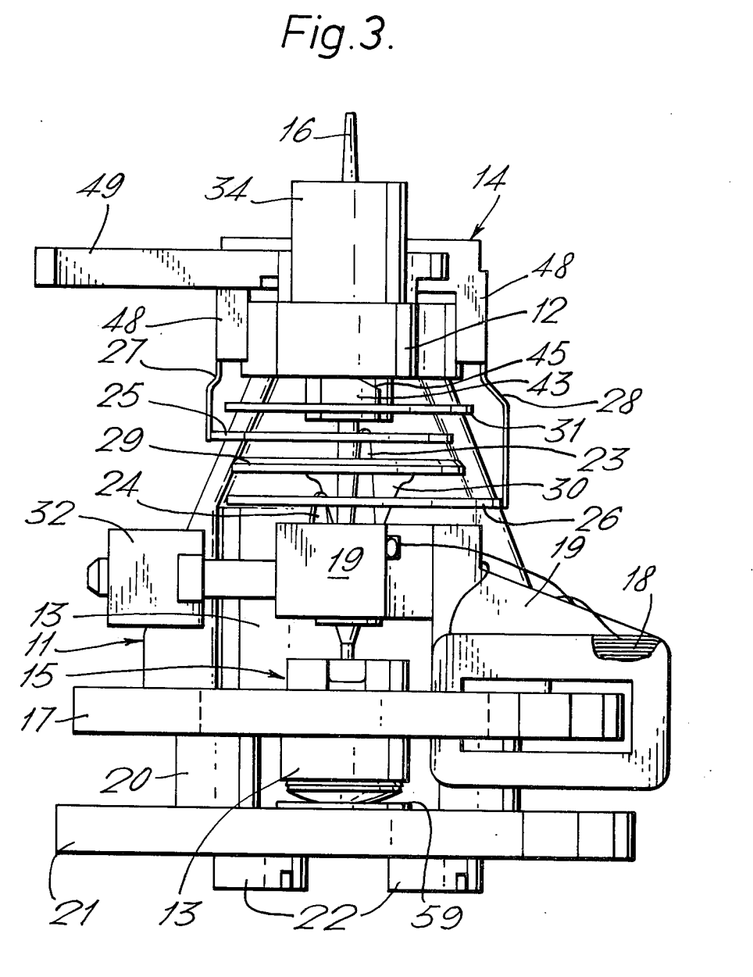
FIG. 3 is a side view in the direction of the arrow III of FIG. 1.
Figure 4:
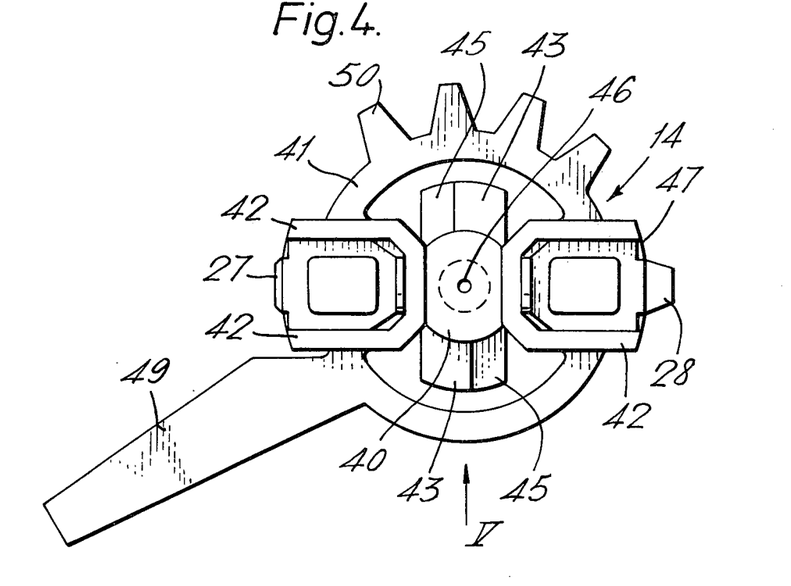
FIG. 4 is a plan view, on an enlarged scale, of an upper bearing of the instrument.
Figure 5:
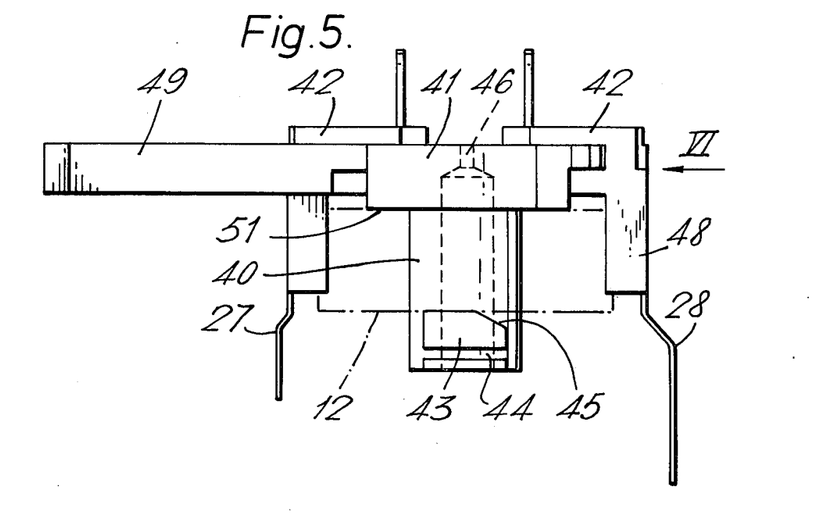
FIG. 5 is a view in the direction of the arrow V of FIG. 4.
Figure 6:
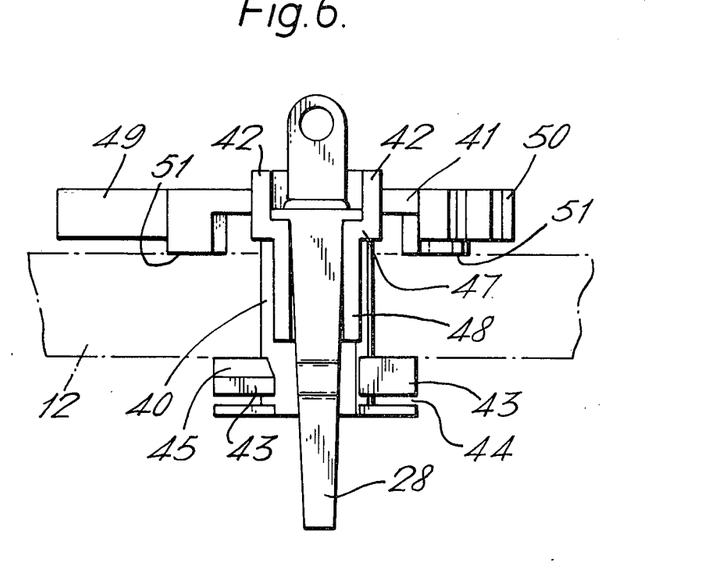
FIG. 6 is a view in the direction of the arrow VI of FIG. 5.
Figure 7:
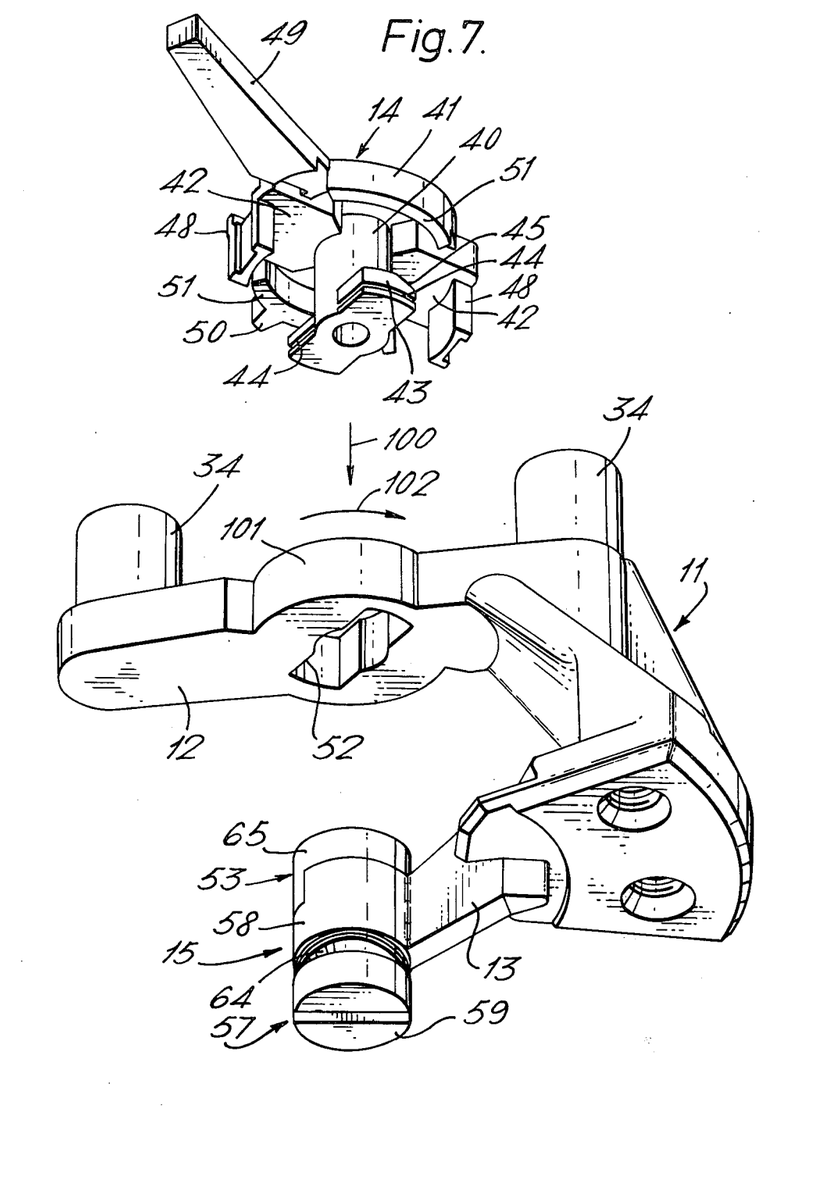
FIG. 7 is an exploded perspective view showing the upper bearing, a frame of the instrument in which the bearings are to be mounted, and a lower bearing mounted on the frame.
Figure 8:
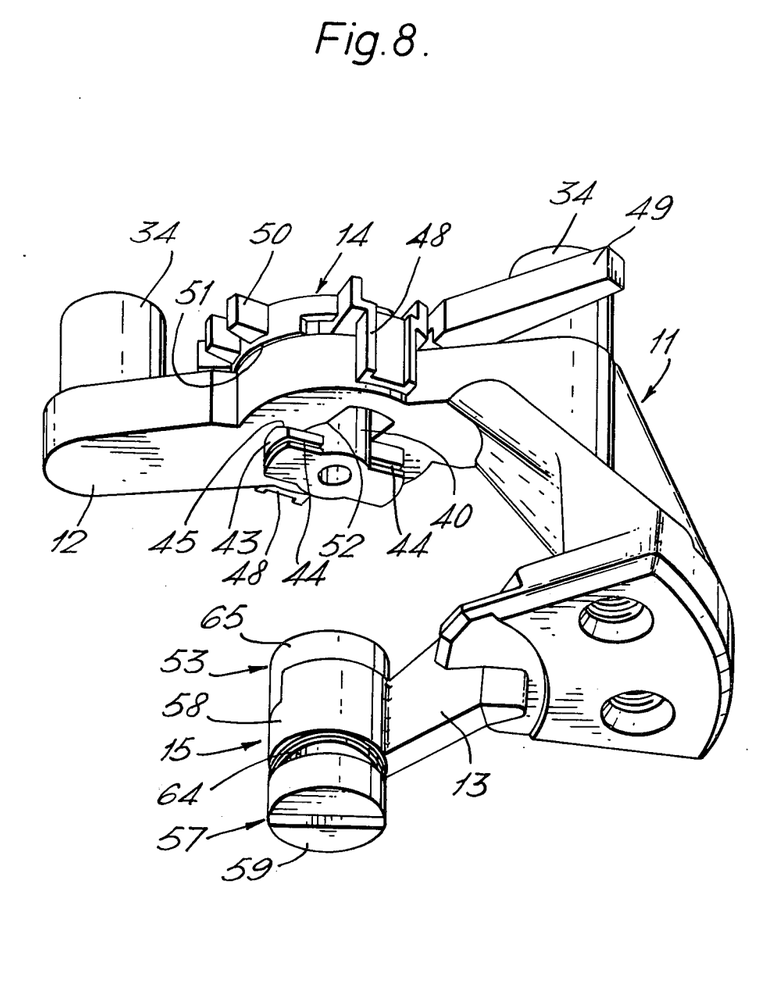
FIG. 8 is a perspective view of the parts of FIG. 7 with both bearings mounted on the frame.

Referring to FIGS. 1 to 3, the instrument includes a cast-alloy, generally U-shaped frame 11 having an upper limb 12 and a lower limb 13 (as viewed in FIGS. 2 and 3). Those limbs 12 and 13 carry respective upper and lower bearings 14 and 15 in which there is journalled a spindle 16. The frame 11 carries an annular magnetic core member 17, embraced by a coil 18 carried on a coil carrier 19, which is a friction fit on the spindle 16. The core member 17 constitutes the upper pole of a magnetic circuit assembly including a permanent magnet 20, and a pole plate 21 which constitutes the lower pole. The core member 17, the magnet 20 and the pole plate 21 are held to the lower limb 13 of the frame 11 by screws 22.

The ends of the coil 18 are connected to tags 23 and 24 on the coil carrier 19. The tags 23 and 24 also support the inner ends of respective upper and lower spiral hairsprings 25 and 26, the outer ends of which are secured to respective tags 27 and 28 on the upper bearing 14. An insulating disc 29, having three spokes (not shown) equally-spaced around the disc, is disposed between the hair-springs 25 and 26 to prevent them touching and short-circuiting under vibration. The disc 29 is supported by means of ribs 30 which project downwardly from the spokes and stand on the coil carrier 19. The upper bearing 14 holds an insulating 'C' clip 31 which prevents the upper hair-spring 25 from touching the upper limb 12 of the frame 11.

The coil 18 and the coil carrier 19 are balanced about the spindle 16 by a counterbalance weight 32 and a counterpoise weight 33 carried by the coil carrier 19.

The upper limb 12 of the frame 11 includes two internally-threaded bushes 34 to support the scale (not shown) which co-operates with a pointer (also not shown) carried on the upper end of the spindle 16.

The operation of the instrument is conventional, current supplied to the coil 18 inducing a magnetic field which interacts with the permanent magnetic field between the core member 17 and the pole plate 21. This interaction results in a torque being applied to the coil 18 in proportion to the magnitude of the current flowing through it, to displace the coil 18 about the spindle 16 to a position in which this torque is offset by that of the hair-springs 25 and 26.

The bearings 14 and 15 and the coil carrier 19 will now be described in greater detail.

The upper bearing 14, shown in FIGS. 4 to 8, is a one-piece plastics moulding having a sleeve 40 in which the upper end of the spindle 16 is to be journalled, and a concentric ring 41 joined to the sleeve 40 by diametrically-opposed spokes 42. The sleeve 40 projects below the ring 41 and at its lower end has two diametrically-opposed projections 43 which extend at right anges to the spokes 42 and which have respective slots 44 to receive the 'C' clip 31. The upper surface of each projection 43 has a bevelled edge 45, the two bevelled edges being on opposite sides of the bearing 14. The bore of the sleeve 40 tapers at its upper end to provide a hole 46 of reduced diameter to support the spindle 16. The tags 27 and 28 are secured to platforms 47 formed integrally with the spokes 42 and have respective downwardly-extending portions 48 at their outer ends which serve to support the tags 27 and 28 and space them from the upper limb 12 of the frame 11. The ring 41 has two arcuate ridges 51 on its underside and carries an arm 49 and four outwardly-projecting teeth 50.

The upper limb 12 of the frame 11 has an aperture 52 therein (shown most clearly in FIG. 7) which is shaped to receive the sleeve 40 and its projections 43, and which is oriented at fortyfive degrees to an imaginary line through the bushes 34. In order to mount the upper bearing 14 on the frame 11, the sleeve 40 and its projections 43 are aligned with the aperture 52 and inserted fully into the aperture 52 in the direction of an arrow 100 (FIG. 7) so that the arcuate ridges 51 abut the upper surface of the limb 11. In this position of the upper bearing 14 the projections 48 overlie respective arcuate edges 101 of the limb 12 centered on the longitudinal axis of the sleeve 40, and the projections 43 extend from the bottom of the aperture 52 with the upper surfaces of the projections 43 being disposed just above the lower surface of the limb 12. The upper bearing 14 is then angularly displaced, by means of the arm 49, in an anticlockwise direction, as indicated by an arrow 102, through 45 degrees. This angular displacement is assisted by the bevelled edges 45 of the projections 43 and in the angularly-displaced position the projections 43 bear against the limb 12 to retain the bearing in its displaced position. This retention of the bearing 14 in its angularly-displaced position is further assisted by serrations on the portion of the upper surface of the limb 12 that is engaged by the arcuate ridges 51.

Figure 9:
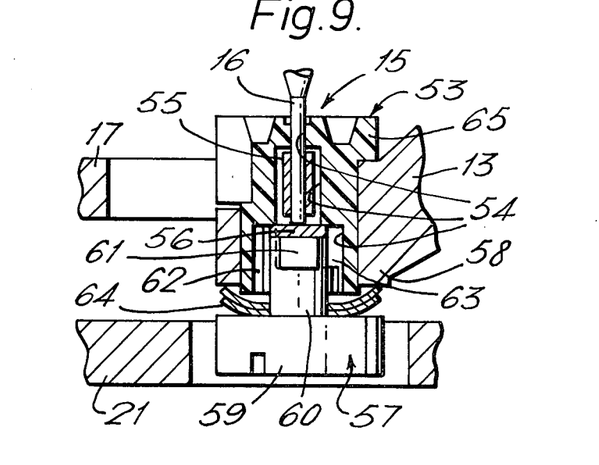
FIG. 9 is a fragmentary sectional side view, to an enlarged scale, showing the lower bearing.
Figures 10, 11:
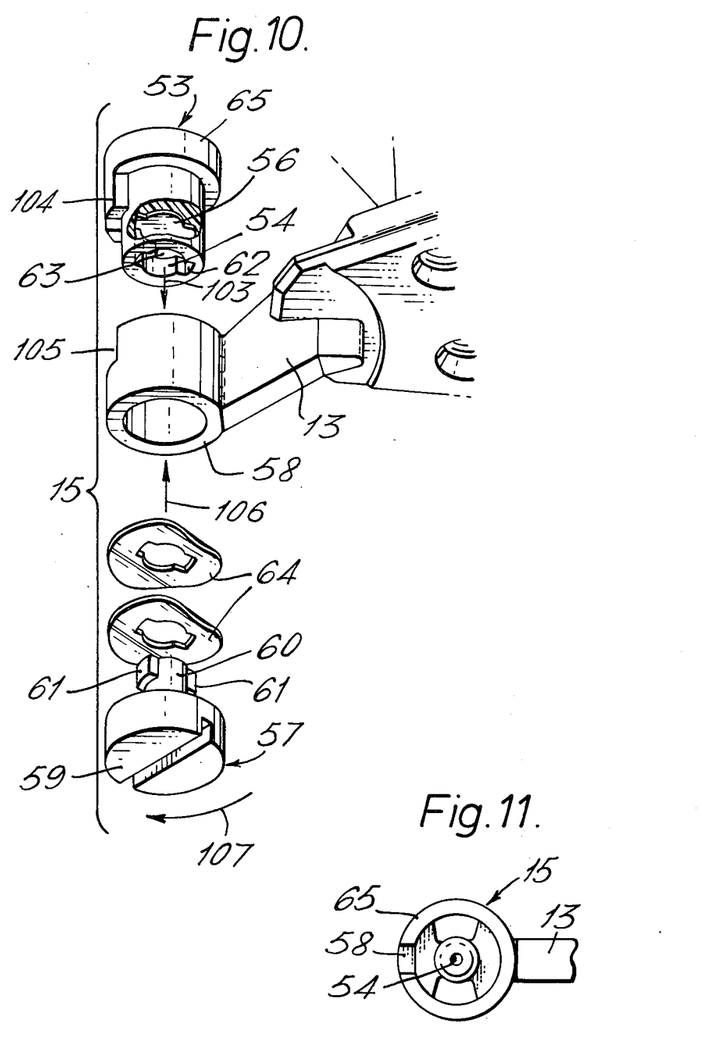
FIG. 10 is an exploded perspective view of the lower bearing.
FIG. 11 is a plan view of the lower bearing.

Referring now to FIGS. 9 to 11, the lower bearing 15 includes a generally cylindrical bearing housing 53 moulded of plastics having a stepped central bore 54. The upper end of the bore 54 receives the lower end of the spindle 16 and supports it laterally. The middle section of the bore 54 is of greater diameter and forms a compartment housing a collar 55 (FIG. 9) carried by a spindle 16. The bottom end of the bore 54 is of larger diameter still, and houses an end-stone 56 which supports the lower end of the spindle 16. The end-stone 56 is retained in the housing 53 by a bayonet bolt 57 of plastics which also secures the housing in a ring 58 formed at the free end of the lower limb 13 of the frame 11. The bayonet bolt 57 has a slotted head 59, and a shank 60 with two diametrically-opposed, radial projections 61 at the free ends thereof. The bottom end of the bore 54 has two recesses 62 to receive the projections 61. At the upper ends of the recesses 62 the housing 53 is shaped to define a pair of arcuate recesses 63 each of which extends from a respective one of the recesses 62 part way round the periphery of the bore 54 to the other recess 62.

To secure the lower bearing 15 to the limb 13 of the frame 11, the housing 53 is first inserted into the ring 58 in the direction of an arrow 103 (FIG. 10) with a projection 104 of the housing disposed in a recess 105 in the ring 58 to prevent rotation of the housing. The bayonet bolt 57 is then inserted into the housing 53 in the direction of an arrow 106 until the projections 61 are aligned with the recesses 63 and the bolt 57 is then turned in a clockwise direction as indicated by the arrow 107 until the projections 61 reach the ends of the respective recesses 63. The shank 60 carries two resilient, bowed washers 64 which engage the underside of the ring 58 (FIG. 9) to urge the bayonet bolt 57 firmly against the lower ledges bounding the arcuate recesses 63 and thereby urge the flange 65 at the upper end of the housing 53 firmly against the upper end of the ring 58.

The compartment containing the collar 55 is filled with viscous silicone fluid to provide damping of the angular motion of the spindle 16.

It will be apparent that neither of the bearings 14 or 15 incorporates any provision for adjustment of the vertical position of the coil carrier 19 or the end-play of the spindle 16 after assembly of the instrument. The vertical position of the coil carrier 19 relative to the core member 17 is determined by the dimensions of the frame 11, the spindle 16, the core member 17, the coil carrier 19 and the bearing housing 53; and by the position of the coil carrier 19 on the spindle 16. This position can be set very accurately during assembly, and the dimensions of the five components listed can be accurately controlled since each is made in one piece. Thus there is no need to provide for adjustment of the position of the coil carrier 19 after assembly.

The end play of the spindle 16 is determined by the distance between the top of the collar 55 and the upper end of its compartment in the bore 54 of the bearing housing 53, and this in turn depends on the length of the compartment and the position of the collar 55 on the spindle 16. The dimensions of the compartment are controlled during the moulding of the bearing housing 53, so the end-play can be simply and accurately set by pushing the collar 55 to the appropriate position on the spindle 16 during assembly. Another advantage of incorporating the collar 55 is that it increases the area available for interaction with the silicone damping fluid, and thus improves the damping effect.

Figure 12:
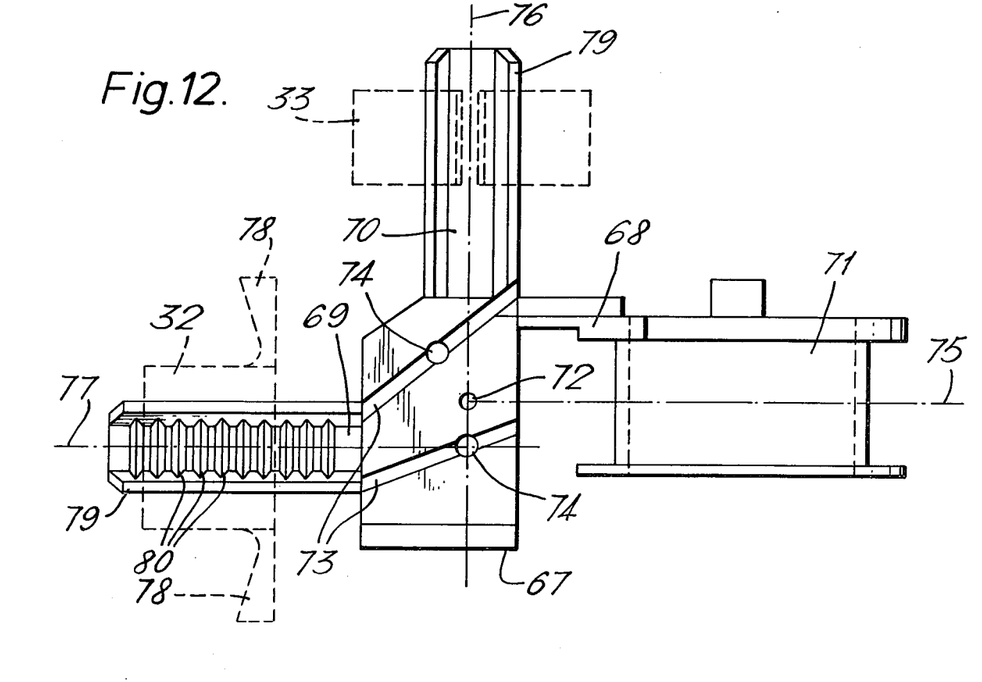
FIG. 12 is a side view, to an enlarged scale, showing a coil carrier of the instrument.

The coil carrier 19, shown in FIG. 12, is a one-piece plastics moulding, and has a main body 67 and three arms 68, 69 and 70 at right angles to one another. The arm 68 has an integral coil former 71, while the arms 69 and 70 carry the counterbalance weight 32 and the counterpoise weight 33 respectively. The main body 67 has a hole 72 for the spindle 16 and two slots 73 with holes 74 to accommodate the tags 23 and 24. The coil former 71 is arranged so that the center of mass of the coil 18 is substantially on a line 75 which intersects the longitudinal axis of the arm 70, indicated by a line 76 in FIG. 12, at right angles at the hole 72 — that is, at the axis of the spindle 16. On the other hand, the arm 69 has its axis (indicated by a line 77) offset from, although parallel to, the line 75 through the center of mass of the coil 18. Thus, the counterbalance weight 32 exerts a balancing moment about the line 76, and also a poising moment about the line 75, so there is no need for the usual second counterpoise weight and arm (opposite the weight 33 and the arm 70) that are required in known instruments. The counterbalance weight 32 is a hollow, cast block of lead and has deformable flanges 78 projecting one on each side. The counterpoise weight 33 is a piece of bent strip metal. Both weights 32 and 33 are an interference fit on longitudinal ribs 79 at the side of their respective arms 69 and 70, and the balance of the coil carrier 19 is adjusted by sliding the weights 32 and 33 along the arms 69 and 70. In the case of the counterbalance weight 32, this sliding provides a coarse adjustment of the counterbalancing. Thereafter, the counterbalance weight 32 is crimped to engage transverse ribs 80 between the longitudinal ribs 79 on the arm 69. The flanges 78 are then deformed to effect fine adjustment of the position of the centre of mass of the counterbalance weight 32. Thus the small auxiliary weights and arms adjacent the main counterbalance weight usually provided in conventional instruments are not required. The balancing arrangement described and illustrated has the advantage that the coil carrier 19 and the weights 32 and 33 are cheap to produce, and the number of adjustments of them are fewer than in conventional instruments.

If the arm 49 of the upper bearing 14 is likely to foul other parts of an assembly containing the instrument, it can be cut off and the teeth 50 used to rotate the upper bearing 14 instead. Conventional zero suppression can be provided if desired by rotating the bearing 14 through a small angle before the scale and pointer are attached.

An advantage of using plastics for the bearings 14 and 15 is that the spindle 16 is consequently electrically isolated from the frame 11, thus avoiding the possibility of the hair-springs 25 and 26 short-circuiting to ground via the spindle 16 when subjected to vibration.

I claim:

1. A moving-coil electrical instrument comprising a frame member defining a pair of aligned apertures, a spindle, a pair of bearings mounted in said apertures, respective ends of said spindle being rotatably mounted in said pair of bearings, one of said bearings having a part mounted in the respective said aperture of the frame member for movement between first and second angular positions about the axis of said spindle, the said one bearing having a supporting surface against which bears the respective end of said spindle, an electric coil, means mounting said electric coil on said spindle for angular displacement about the axis thereof, a core member of a magnetic circuit embraced by said coil, and means engageable by said part of said one bearing to constitute a bayonet mounting to mount the said part in the respective said aperture when in said first angular position with the said supporting surface located at a predetermined and fixed position within said one bearing and to permit removal of the said part from the respective said aperture when in said second angular position.

2. An electrical instrument according to claim 1, wherein the said one bearing includes a second part defining an aperture in which the respective end of said spindle is rotatably mounted, the said first-mentioned part being angularly displaceable relative to the said second part about the said axis between the first and second angular positions.

3. An electrical instrument according to claim 2, wherein the said second part includes the said means engageable by the said part, the first-mentioned part and the second part cooperating with one another to mount the first-mentioned part on the second part when in said first angular position and to permit removal of the first-mentioned part from the second part when in said second angular position.

4. An electrical instrument according to claim 3, wherein the frame member is a unitary member.

5. An electrical instrument according to claim 4, wherein the said supporting surface of the said one bearing against which the respective end of the spindle bears is provided by a member which is clamped between the first-mentioned part, when in said first angular position, and the said second part.

6. An electrical instrument according to claim 5, wherein said member which provides the supporting surface is a metal plate.

7. An electrical instrument according to claim 6, wherein the first-mentioned part includes a projection and the second part includes a surface, the said projection and the said surface together constituting the bayonet mounting.

8. An electrical instrument according to claim 7, including a compartment in said second part in which the respective end of the spindle is disposed, and a collar in said compartment carried by that end of the spindle.

9. An electrical instrument according to claim 8, in which said compartment is filled with viscous fluid.

10. A moving-coil electrical instrument comprising a frame member defining a pair of aligned apertures, a spindle, a pair of bearings mounted in said apertures in which respective ends of the spindle are rotatably mounted, each of said bearings having a part mounted in the respective said aperture for movement between first and second angular positions about the axis of the spindle, one of said bearings having a supporting surface against which the respective end of the spindle bears, an electrical coil, means mounting the electric coil on the spindle for angular displacement about the axis thereof, a core member of a magnetic circuit embraced by said coil, and first and second means engageable by respective ones of said bearing parts to constitute bayonet mountings to mount those parts in their respective said apertures in said frame member when in said first angular positions with the said supporting surface of the said one bearing located at a predetermined and fixed position within the said one bearing, and to permit removal of those parts from their respective said apertures when in said second angular positions.

11. An electrical instrument according to claim 10, wherein the first-mentioned part of the other of said pair of bearings is shaped to define an aperture through which the respective end of the spindle extends when in said first angular position.

12. An electrical instrument according to claim 11, wherein the said first-mentioned part of the other of said pair of bearings is secured directly to the frame member when in said first angular position, such securement being provided by engagement between a projection on that first mentioned part and a surface on the said frame member.

13. An electrical instrument according to claim 12, wherein the said one bearing includes a second part defining an aperture in which the respective end of said spindle is rotatably mounted, the first-mentioned part being angularly displaceable relative to the said second part about the said axis between first and second angular positions.

14. An electrical instrument according to claim 13, wherein the second part includes said mounting means to mount the first-mentioned part on the second part when in said first angular position and to permit removal of the first-mentioned part from the second part when in said second angular position.

15. An electrical instrument according to claim 14, wherein said frame member is a unitary member.

16. A moving-coil electrical instrument comprising a frame member defining a pair of aligned apertures, a spindle, a pair of bearings mounted in said apertures in which respective ends of the spindle are rotatably mounted, each of said bearings having a part mounted in the respective said aperture for movement between first and second angular positions about the axis of the spindle, one of said bearings having a supporting surface against which the respective end of the spindle bears, an electrical coil, means mounting the electric coil on the spindle for angular displacement about the axis thereof, a core member of a magnetic circuit embraced by said coil, and first and second means engageable by the said part of said one bearing and the said part of the other bearing respectively to constitute bayonet mountings to mount the said parts in their respective said apertures when in said first angular positions with the said supporting surface of the said one bearing located at a predetermined and fixed position within the said one bearing, and to permit removal of those parts from their respective said apertures when in said second angular positions, the said first and second means being constituted by a second part of the said one bearing and the frame member respectively.

17. A moving-coil electrical instrument comprising a frame member defining a pair of aligned apertures, a spindle, a pair of bearings mounted in said apertures in which respective ends of the spindle are rotatably mounted, one of said bearings having a part mounted in the respective said aperture of the frame member for movement between first and second angular positions about the axis of the spindle, the said one bearing having a supporting surface against which bears the respective end of the spindle, a carrier member mounted on the said spindle, an electric coil mounted on the carrier member with the coil being radially displaced from the spindle, a body mounted on the carrier member to counter-balance the coil, the center of mass of the said body being spaced from the plane which includes both the center of mass of the coil and the longitudinal axis of the spindle, a core member of a magnetic circuit embraced by said coil, and means engageable by said part of said one bearing to constitute a bayonet mounting to mount the said part in the respective said aperture when in said first angular position with the said supporting surface located at a predetermined and fixed position within said one bearing and to permit removal of the said part from the respective said aperture when in said second angular position.

* * * * *